(12) United States Patent
Ko et al.

(10) Patent No.: US 9,087,877 B2
(45) Date of Patent: Jul. 21, 2015

(54) LOW-K INTERCONNECT STRUCTURES WITH REDUCED RC DELAY

(75) Inventors: Chung-Chi Ko, Nautou (TW); Ting-Yu Shen, Jiji (TW); Keng-Chu Lin, Ping-Tung (TW); Chia-Cheng Chou, Keelung (TW); Tien-I Bao, Hsin-Chu (TW); Shwang-Ming Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 701 days.

(21) Appl. No.: 11/585,610

(22) Filed: Oct. 24, 2006

(65) Prior Publication Data

US 2008/0096380 A1    Apr. 24, 2008

(51) Int. Cl.
*H01L 21/4763*    (2006.01)
*H01L 21/768*    (2006.01)

(52) U.S. Cl.
CPC .... *H01L 21/76831* (2013.01); *H01L 21/76826* (2013.01)

(58) Field of Classification Search
CPC ................. H01L 21/76831; H01L 32/76826
USPC ......... 438/643, 653, 622, 626–629, 631, 633, 438/644, 648, 649, 657, 719, 753; 257/751–754
See application file for complete search history.

(56) References Cited

U.S. PATENT DOCUMENTS

| | | | | |
|---|---|---|---|---|
| 5,238,866 A * | 8/1993 | Bolz et al. | ...................... | 427/595 |
| 5,272,715 A * | 12/1993 | Guerin | ............................. | 372/98 |
| 5,696,387 A * | 12/1997 | Choi et al. | ....................... | 257/57 |
| 6,153,519 A * | 11/2000 | Jain et al. | ....................... | 438/681 |
| 6,174,809 B1 * | 1/2001 | Kang et al. | ..................... | 438/682 |
| 6,214,731 B1 * | 4/2001 | Nogami et al. | ............... | 438/687 |
| 6,265,303 B1 * | 7/2001 | Lu et al. | ......................... | 438/623 |
| 6,351,039 B1 * | 2/2002 | Jin et al. | ......................... | 257/759 |
| 6,358,829 B2 * | 3/2002 | Yoon et al. | ..................... | 438/597 |
| 6,376,371 B1 * | 4/2002 | Jain et al. | ....................... | 438/681 |
| 6,461,211 B1 * | 10/2002 | Raina et al. | ...................... | 445/24 |
| 6,511,539 B1 * | 1/2003 | Raaijmakers | .................. | 117/102 |
| 6,528,423 B1 * | 3/2003 | Catabay et al. | ............... | 438/687 |
| 6,649,512 B1 * | 11/2003 | Lee et al. | ....................... | 438/623 |
| 6,686,271 B2 * | 2/2004 | Raaijmakers et al. | ........ | 438/633 |
| 6,723,635 B1 * | 4/2004 | Ngo et al. | ....................... | 438/627 |
| 6,838,772 B2 * | 1/2005 | Saitoh et al. | ................... | 257/758 |
| 6,972,253 B2 * | 12/2005 | Liu et al. | ........................ | 438/627 |
| 6,975,033 B2 * | 12/2005 | Ito et al. | ......................... | 257/761 |
| 7,026,238 B2 * | 4/2006 | Xi et al. | ......................... | 438/625 |
| 7,060,330 B2 * | 6/2006 | Zheng et al. | ................... | 427/551 |
| 7,098,131 B2 * | 8/2006 | Kang et al. | ..................... | 438/648 |
| 7,235,482 B2 * | 6/2007 | Wu et al. | ........................ | 438/674 |
| 7,309,658 B2 * | 12/2007 | Lazovsky et al. | ............. | 438/754 |
| 7,335,586 B2 * | 2/2008 | RamachandraRao et al. | ............. | 438/637 |
| 7,351,628 B2 * | 4/2008 | Forbes et al. | ................. | 438/199 |
| 7,439,315 B2 * | 10/2008 | Kunimi et al. | ................ | 526/285 |
| 7,442,756 B2 * | 10/2008 | Heiliger et al. | ................ | 528/27 |

(Continued)

*Primary Examiner* — Bradley K Smith
*Assistant Examiner* — David Goodwin
(74) *Attorney, Agent, or Firm* — Slater & Matsil, L.L.P.

(57) ABSTRACT

A method for forming an integrated circuit includes forming a low-k dielectric layer over a semiconductor substrate, etching the low-k dielectric layer to form an opening, forming a dielectric barrier layer covering at least sidewalls of the opening, performing a treatment to improve a wetting ability of the dielectric barrier layer, and filling the opening with a conductive material, wherein the conductive material is in contact with the dielectric barrier layer.

15 Claims, 6 Drawing Sheets

(56) References Cited

U.S. PATENT DOCUMENTS

| | | | |
|---|---|---|---|
| 7,514,353 B2* | 4/2009 | Weidman et al. | 438/627 |
| 7,564,136 B2* | 7/2009 | Yeh et al. | 257/773 |
| 7,892,602 B2* | 2/2011 | Chung et al. | 427/255.391 |
| 7,939,455 B2* | 5/2011 | Clark | 438/758 |
| 8,072,075 B2* | 12/2011 | Jourdan et al. | 257/767 |
| 2002/0137360 A1* | 9/2002 | Tsai et al. | 438/782 |
| 2003/0139034 A1* | 7/2003 | Yuang | 438/634 |
| 2004/0121586 A1* | 6/2004 | Abell | 438/637 |
| 2004/0127027 A1* | 7/2004 | Lee et al. | 438/683 |
| 2005/0148202 A1* | 7/2005 | Heiliger et al. | 438/778 |
| 2005/0208758 A1* | 9/2005 | Lu et al. | 438/623 |
| 2005/0227502 A1* | 10/2005 | Schmitt et al. | 438/788 |
| 2005/0233591 A1* | 10/2005 | Schmitt et al. | 438/706 |
| 2005/0239278 A1* | 10/2005 | Li et al. | 438/618 |
| 2006/0019485 A1* | 1/2006 | Komai et al. | 438/627 |
| 2006/0172531 A1* | 8/2006 | Lin et al. | 438/637 |
| 2006/0216928 A1* | 9/2006 | Chung et al. | 438/630 |
| 2007/0134900 A1* | 6/2007 | Ang | 438/597 |
| 2007/0190779 A1* | 8/2007 | Garg et al. | 438/643 |
| 2007/0190784 A1* | 8/2007 | Cui et al. | 438/687 |
| 2008/0070421 A1* | 3/2008 | Xu et al. | 438/786 |

* cited by examiner

LOW-K INTERCONNECT STRUCTURES WITH REDUCED RC DELAY

TECHNICAL FIELD

This invention relates generally to integrated circuits, and more particularly to the design and formation methods of interconnect structures of the integrated circuits.

BACKGROUND

As the semiconductor industry introduces new generations of integrated circuits (IC's) having higher performance and greater functionality, the density of the elements that form the integrated circuits increases, and the dimensions, sizes and spacing between the individual components or elements are reduced. While in the past such reductions were limited only by the ability to define the structures photo-lithographically, device geometries having even smaller dimensions created new limiting factors. For example, for any two adjacent conductive paths, as the distance between the conductors decreases, the resulting capacitance (a function of the dielectric constant (k) of the insulating material divided by the distance between conductive paths) increases. This increased capacitance results in increased capacitive coupling between the conductors, increased power consumption, and an increased resistive-capacitive (RC) time constant. Therefore, continual improvement in semiconductor IC performance and functionality is dependent upon developing materials that comprise a dielectric film with a lower dielectric constant (low-k) than that of the most commonly used material, silicon oxide, in order to reduce capacitance.

Figure 1:
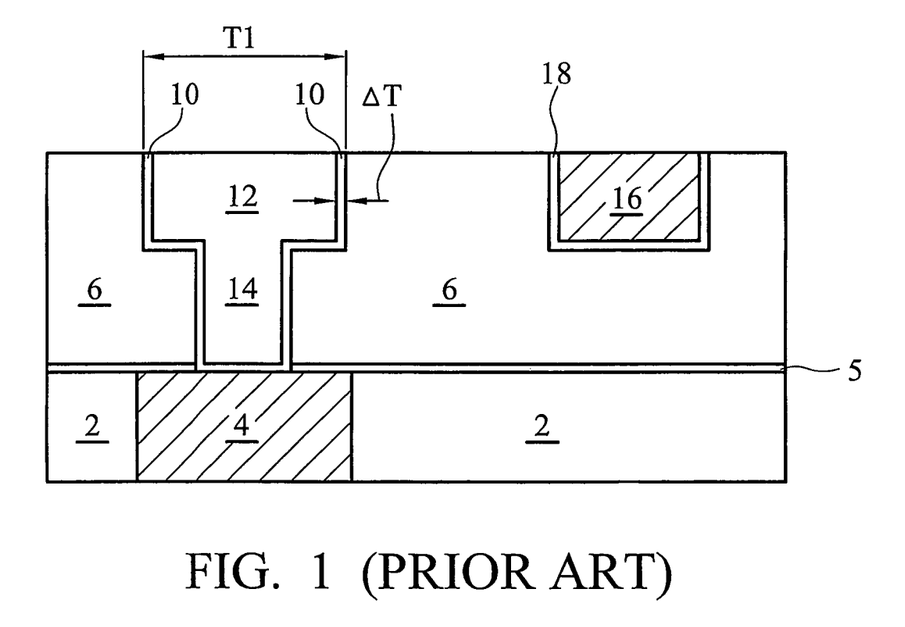
FIG. 1 illustrates a conventional interconnect structure including a low-k dielectric material and a conductive diffusion barrier layer.

To suit the characteristics of low-k dielectric materials, various structures and formation methods have been developed for the formation of interconnect structures. FIG. 1 illustrates a conventional formation scheme for interconnect structures. A first copper line 4 is formed in a low-k dielectric layer 2. Etch stop layer 5 is formed on low-k dielectric layer 2. A second copper line 12 is electrically coupled to copper line 4 through a via 14. The second copper line 12 and via 14 are formed in low-k dielectric layer 6. Diffusion barrier layer 10 is formed over sidewalls of a trench opening and a via opening, in which copper line 12 and via 14 are formed, respectively.

It is noted that in FIG. 1, diffusion barrier layer 10 occupies spaces in the via opening and the trench opening. Assuming copper line 12 has width T1 of 1000 Å, and diffusion barrier layer 10 has a thickness $\Delta T$ of 70 Å, the cross-sectional area of copper line 12 is reduced by about (2*70)/1000, or 14 percent. Diffusion barrier layer 10 typically includes tantalum, tantalum nitride, titanium, or titanium nitride, and typically has significantly higher resistivity than copper. Therefore, diffusion barrier layer 10 causes an increase in the resistance of a metal line, which includes copper line 12 and diffusion barrier layer 10. On the other hand, since diffusion barrier layer 10 is still conductive, the parasitic capacitance between metal line 12 and neighboring conductive features, such as copper line 16 (and the respective diffusion barrier layer 18), is not reduced. As a result, RC delay observed by copper line 12 is increased due to the formation of diffusion barrier layer 10.

Methods for overcoming the above-discussed drawbacks have been explored. For example, it has been proposed to replace diffusion barrier layer 10 with a dielectric layer. Since the distance between the neighboring metal lines are increased by 2*$\Delta T$, the parasitic capacitance between metal lines 12 and 16 is reduced, and overall RC delay observed by copper line 12 is reduced.

The proposal of replacing diffusion barrier layer 10 with dielectric material has encountered difficulties, however. Typically, copper and dielectric layers, particularly dielectric layers having low k values, have bad adhesion. In the subsequent baking processes, copper line 12 may delaminate from dielectric diffusion barrier layer. Accordingly, new structures and/or methods for solving this problem are needed.

SUMMARY OF THE INVENTION

In accordance with one aspect of the present invention, a method for forming an integrated circuit includes forming a low-k dielectric layer over a semiconductor substrate, etching the low-k dielectric layer to form an opening, forming a dielectric barrier layer covering at least sidewalls of the opening, performing a treatment to the dielectric barrier layer, and filling the opening with a conductive material, wherein the conductive material is in contact with the dielectric barrier layer.

In accordance with another aspect of the present invention, a method for forming an integrated circuit includes forming a porous dielectric layer over a semiconductor substrate, forming an opening in the porous dielectric layer, sealing the porous dielectric layer with a dielectric barrier layer, treating the dielectric barrier layer to improve a wetting ability of the dielectric barrier layer, and filling the opening with a conductive material, wherein the conductive material is in direct contact with the dielectric barrier layer.

The advantageous features of the present invention include reduced parasitic resistance between neighboring metal lines and improved adhesion between the dielectric barrier layer and copper.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming a low-k dielectric layer and a corresponding interconnect structure is provided. The intermediate stages for manufacturing the preferred embodiment of the present invention are illustrated. Variations of the preferred embodiments are then discussed. Throughout the various views and illustrative embodiments of the present invention, like reference numbers are used to designate like elements.

Figure 2:
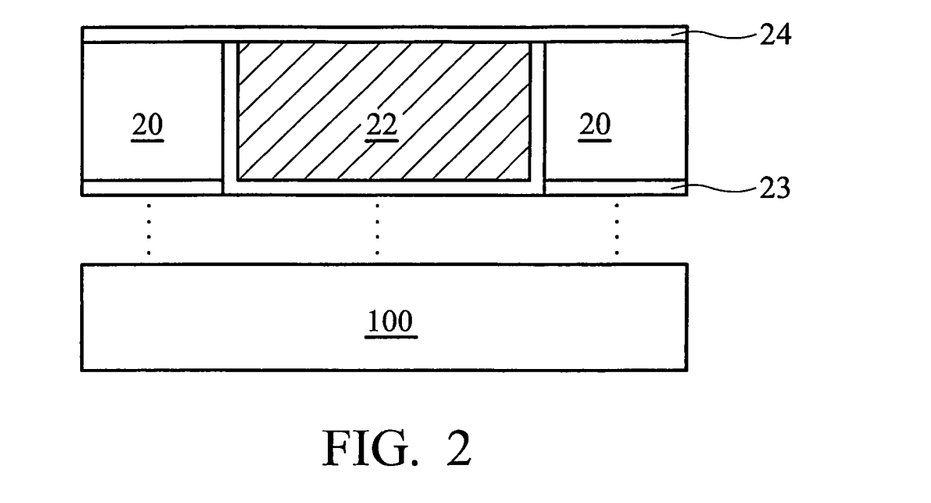
FIGS. 2 through 7 are cross-sectional views of intermediate stages in the manufacturing of a preferred interconnect structure comprising a dielectric barrier layer, wherein a dual damascene process is illustrated.

FIG. 2 illustrates a starting structure, wherein a conductive line 22 is formed in a dielectric layer 20. Conductive line 22 and dielectric layer 20 are over a semiconductor substrate 100, which is preferably a silicon substrate having semiconductor devices formed thereon. For simplicity, substrate 100 is omitted in subsequent drawings. Conductive line 22 is preferably a metal line comprising copper, tungsten, aluminum, silver, gold, and combinations thereof. Conductive line 22 may be connected to another underlying feature (not shown), such as a via or a contact plug. Dielectric layer 20 may be an inter-metal dielectric (IMD) layer, preferably having a low dielectric constant (k value). In a first embodiment, as shown in FIG. 2, an etch stop layer 23 is formed between dielectric layer 20 and the underlying layer (not shown). In alternative embodiment, the etch stop layer 23 is not formed.

Etch stop layer (ESL) 24 is formed on dielectric layer 20 and conductive line 22. Preferably, ESL 24 comprises nitrides, silicon-carbon based materials, carbon-doped oxides, and combinations thereof. The preferred formation method includes plasma enhanced chemical vapor deposition (PECVD). However, other commonly used deposition methods such as high-density plasma CVD (HDPCVD), atomic layer CVD (ALCVD), and the like, can also be used. In an exemplary embodiment, wherein ESL 24 comprises silicon nitride or silicon carbide, the formation is preferably performed in a chamber, in which gaseous precursors such as silane ($SiH_4$) and ammonia ($NH_3$) are introduced, and a chemical reaction occurs with the assistance of plasma.

In alternative embodiments, dielectric layer 24 is a diffusion barrier layer, which is used for preventing undesirable elements, such as copper, from diffusing into the subsequently formed low-k dielectric layer. In a more preferred embodiment, dielectric layer 24 acts as both an etch stop layer and a diffusion barrier layer.

Figure 3:
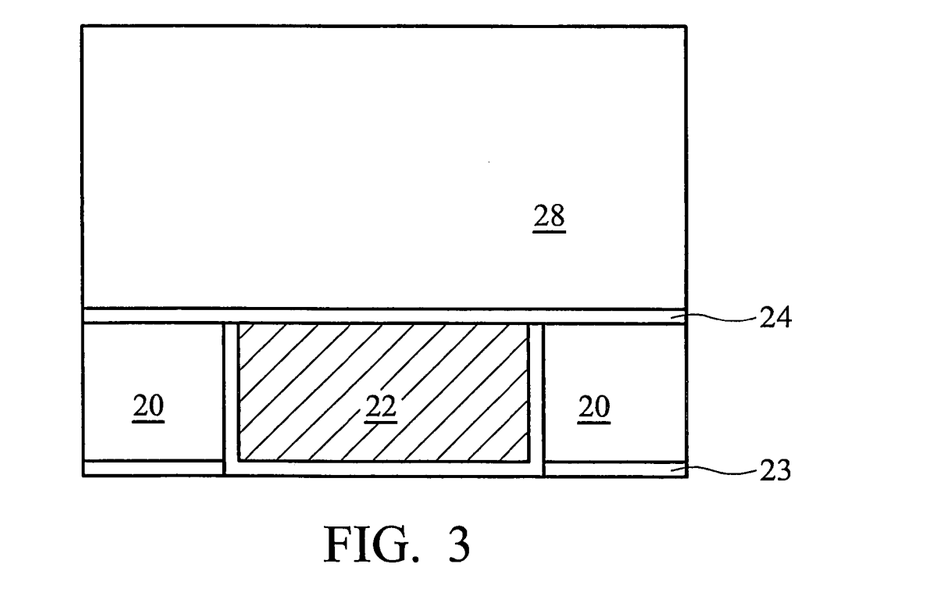

FIG. 3 illustrates the formation of a dielectric layer 28, which provides insulation between conductive line 22 and the overlying conductive lines that will be subsequently formed. In the preferred embodiment, dielectric layer 28 has a low dielectric constant, hence is referred to as a low-k dielectric layer 28 throughout the description. In other embodiments, dielectric layer 28 may have a high k value such as greater than about 3.5. Low-k dielectric layer 28 preferably has a k value of lower than about 3.5, and more preferably lower than about 2.5. The preferred materials include carbon-containing materials, organo-silicate glass, porogen-containing materials, and combinations thereof. Low-k dielectric layer 28 may be deposited using a chemical vapor deposition (CVD) method, preferably PECVD, although other commonly used deposition methods such as low pressure CVD (LPCVD), ALCVD and spin-on, can also be used.

A first treatment, which preferably includes a curing process, is then performed. The curing process may be performed using commonly used curing methods, such as ultraviolet (UV) curing, eBeam curing, thermal curing, and the like, and may be performed in a production tool that is also used for PECVD, atomic layer deposition (ALD), LPCVD, etc. The curing may be performed in a vacuum environment or in an environment containing process gases such as $H_2$, $N_2$, inert gases including He, Ne, Ar, Kr, Xe, Rn, and combinations thereof.

The treatment serves the function of driving porogen out of low-k dielectric layer 28 and improving its mechanical property. Pores will then be generated in low-k dielectric layer 28, and the k value will be reduced.

Figure 4:
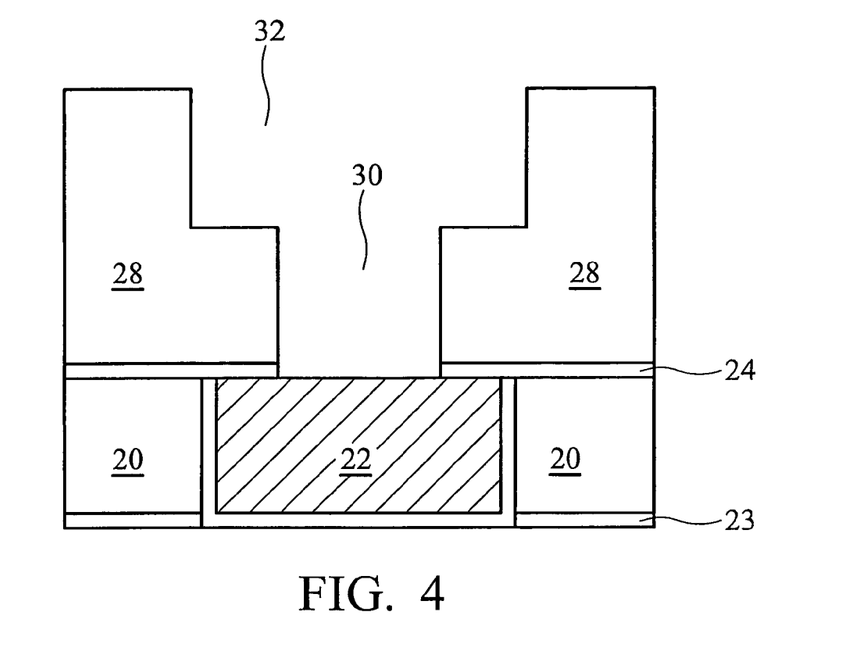

FIG. 4 illustrates the formation of a via opening 30 and a trench opening 32 in low-k dielectric layer 28. Photo resists (not shown) are formed and patterned over low-k dielectric layer 28 to aid in the formation of via opening 30 and trench opening 32. In the preferred embodiment, an anisotropic etch cuts through the low-k dielectric layer 28 and stops at ESL 24, thereby forming a via opening 30. Trench opening 32 is then formed. In alternative embodiments, a trench-first approach is taken, in which trench opening 32 is formed prior to the formation of via opening 30. ESL 24 is then etched through via opening 30, exposing underlying conductive line 22. Alternatively, ESL 24 may be left in place, and removed together with the subsequently formed dielectric diffusion barrier layer 34 (refer to FIG. 6).

In alternative embodiments, low-k dielectric layer 28 may be replaced by a stacked layer including a first low-k dielectric layer, an ESL on the first low-k dielectric layer, and a second low-k dielectric layer on the ESL (not shown). The ESL is used for stopping the formation of trench opening 32. One skilled in the art will realize the appropriate process steps.

Figure 5:
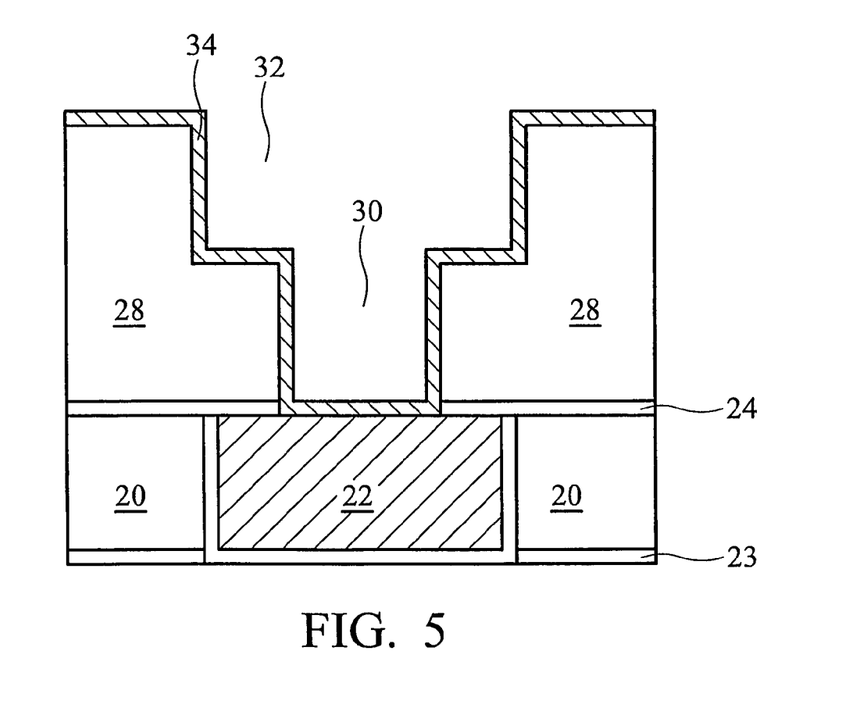

FIG. 5 illustrates the formation of a dielectric layer 34. In the preferred embodiment, dielectric barrier layer 34 is formed by ATRP ($C_{10}H_6$, also referred to as α-Terpinene). The k value of dielectric barrier layer 34 is preferably between about 2.5 and about 5.5.

In an exemplary embodiment, dielectric barrier layer 34 includes carbon, which may be formed of ATRP. The corresponding process gases include tetramethysilane (4MS) only, a combined gas of 4MS and $NH_3$, He, and combinations thereof. The process conditions include a chamber pressure of between about 1.5 torr and about 8 torr, a duration of between about 10 seconds and about 600 seconds, and a temperature of between about 200° C. and about 400° C.

In the embodiment wherein dielectric barrier layer 34 comprises relatively big atoms/molecules, which are bigger than the surface pores of low-k dielectric layer 28, a separate dielectric barrier layer 34 is formed on the exposed surface of low-k dielectric layer 28. Preferably, dielectric barrier layer 34 has a thickness of between about 10 Å and about 100 Å, and more preferably between about 50 Å and about 70 Å. In alternative embodiments wherein the deposited atoms/molecules are smaller than the surface pores of low-k dielectric layer 28, infiltration may occur so that deposited material substantially fills the surface pores of low-k dielectric layer 28, and the resulting low-k dielectric barrier layer 34 is the modification of a surface layer of low-k dielectric layer 28.

A treatment is then performed to improve the wetting ability of dielectric barrier layer 34, which in turn improves the adhesion between low-k dielectric barrier layer 34 and the layer formed thereon. In the preferred embodiment, the treatment includes plasma treatment, thermal treatment, e-beam treatment, UV treatment, and the like.

In a first embodiment, the treatment to dielectric barrier layer 34 includes two steps. In a first step, a pre-treatment is performed. Process gases for the pre-treatment preferably include a combined gas of $N_2$ and $NH_3$. In an exemplary embodiment, the pre-treatment is performed with a chamber pressure of between about 1.5 torr and about 8 torr, a substrate temperature of between about 200° C. and about 400° C., a process gas flow rate of between about 100 sccm and about 3000 sccm, and a treatment duration of between about 10 seconds—and about 600 seconds. In a second step, a post-treatment is performed, which process gases preferably include SiH$_4$. Hydrogen (H$_2$) may also be added. In an exemplary embodiment, the post-treatment is performed with a chamber pressure of between about 1.5 torr and about 8 torr, a substrate temperature of between about 200° C. and about 400° C., a process gas flow rate of between about 100 sccm and about 3000 sccm, and a treatment duration of about 10 seconds and about 600 seconds.

In alternative embodiments, the treatment to dielectric barrier layer 34 includes plasma treatment in a combined gas including N$_2$, NH$_3$, and SiH$_4$. H$_2$ may also be added. In an exemplary embodiment, the treatment is performed with a chamber pressure of about 1.5 torr to about 8 torr, a substrate temperature of about 200° C. and about 400° C., a process gas flow rate of between about 100 sccm and about 6000 sccm, and a treatment duration of about 10 seconds and about 600 seconds.

Figure 6:
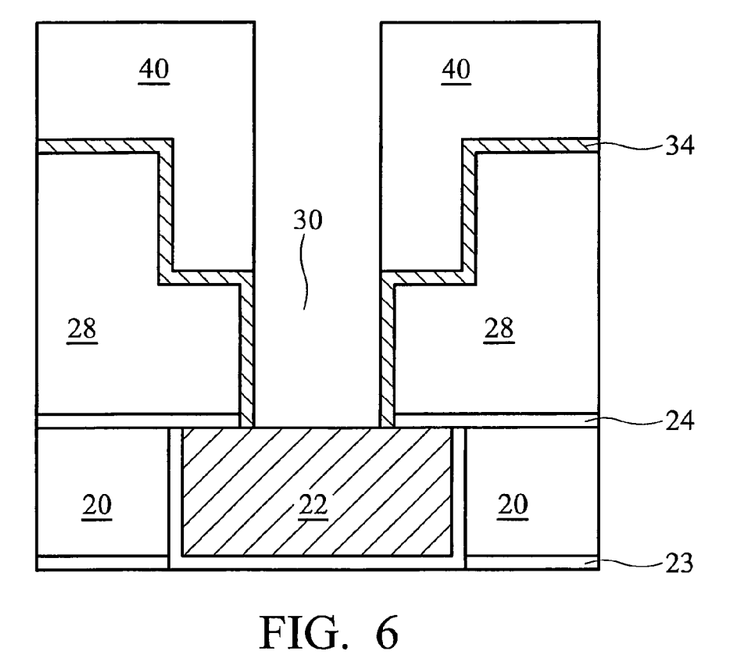

FIG. 6 illustrates the removal of dielectric barrier layer 34 from the bottom of via opening 30, which may be performed by forming and patterning photo resist 40, wherein the bottom of via opening 30 is exposed, and etching dielectric barrier layer 34 from the bottom of via opening 30. Photo resist 40 is then removed. In an embodiment, no additional barrier layer is formed between dielectric barrier layer 34 and photo resist 40. Accordingly, no additional barrier layer is formed between dielectric barrier layer 34 and the metal features including via 42 and metal line 44 (not shown in FIG. 6, please refer to FIG. 7).

Figure 7:
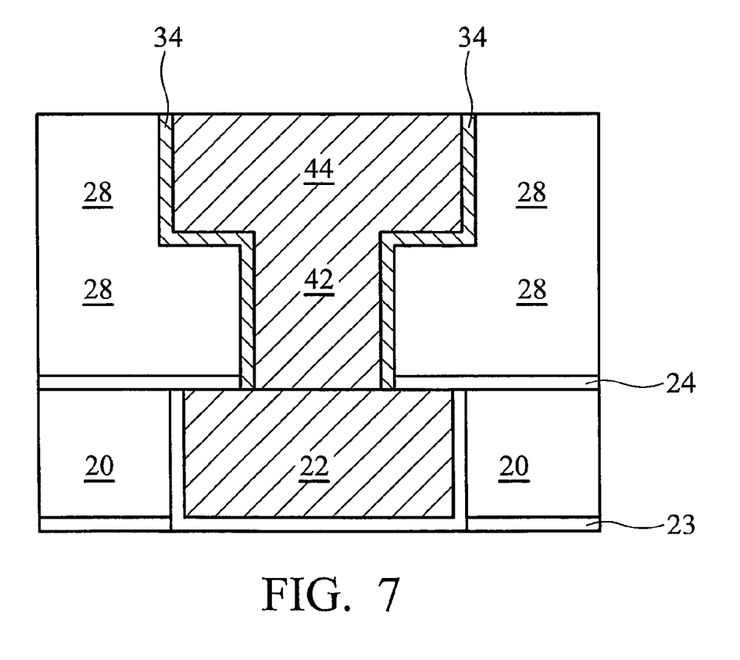

Referring to FIG. 7, via opening 30 and trench opening 32 are filled with a conductive material, preferably copper or copper alloys. However, other metals and metal alloys such as aluminum, tungsten, silver and gold can also be used. As is known in the art, the filling of via opening 30 and trench opening 32 may include depositing a copper seed layer (not shown) and plating copper to fill via opening 30 and trench opening 32. A chemical mechanical polish is then performed to level the surface of the filling material to a top surface of low-k dielectric layer 28, forming via 42 and metal line 44.

Figure 8:
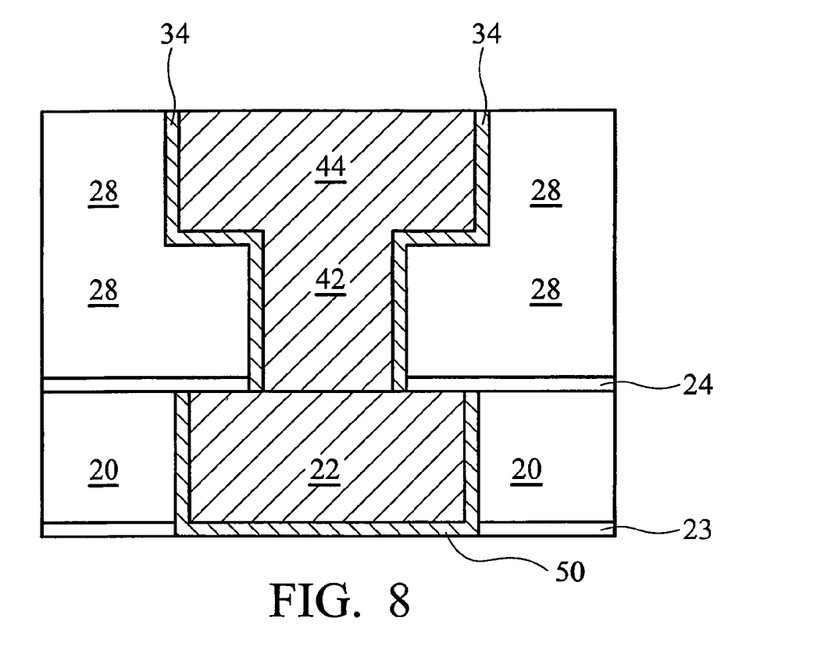
FIG. 8 illustrates an interconnect structure comprising a dielectric barrier layer, wherein a single damascene structure is further illustrated.

The previously discussed embodiment illustrates the formation of a dual damascene structure. It is appreciated that the methods discussed in the preceding paragraphs are readily available for single damascene process. FIG. 8 illustrates a dielectric barrier layer 50 formed in a single damascene structure. With the teaching provided in the preceding paragraphs, one skilled in the art will realize the respective process steps. In addition, barrier layer 34 may be formed for interconnected structures formed in high-k dielectric layers, for example, SiO$_2$ layers.

Figure 9:
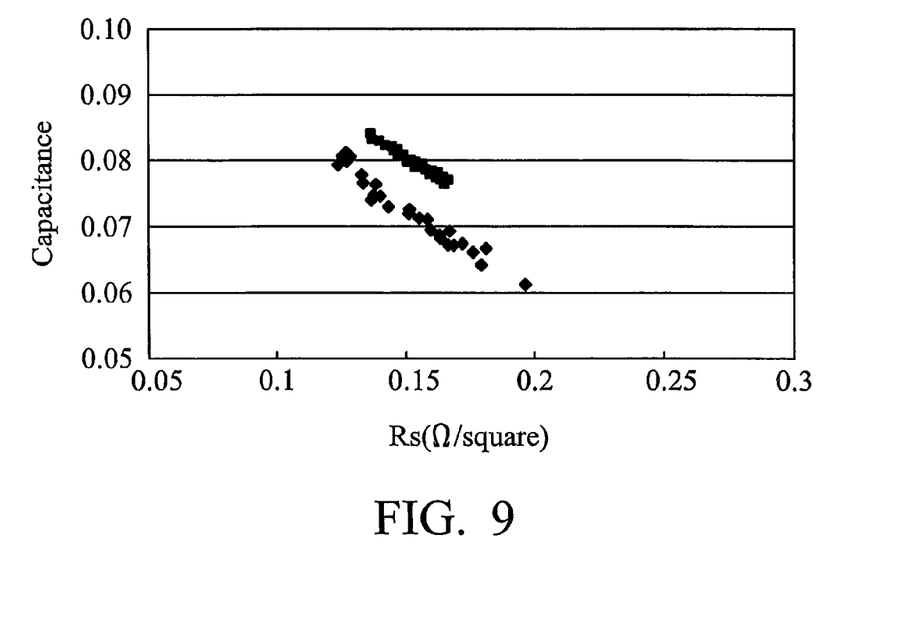
FIG. 9 illustrates parasitic capacitances between neighboring metal lines as a function of sheet resistances of metal lines.

Experiment results of the present invention are illustrated in FIG. 9, which shows parasitic capacitances between neighboring copper lines as a function of sheet resistances. Diamonds indicate results measured from a sample formed using the preferred embodiment of the present invention, while squares indicate results measured from a sample having a similar structure and same dimensions, except that a TaN diffusion barrier layer, instead of a dielectric barrier layer, is used. The results revealed that for a same sheet resistance, the parasitic capacitance of the sample, having a dielectric barrier layer, is lower than the parasitic capacitance of the sample having a TaN diffusion barrier layer. Therefore, the overall RC delay of the interconnect structures may be reduced by using the embodiments of the present invention. Further experiments have revealed that the uniformity of the samples of the present invention is improved over samples having TaN diffusion barrier layers.

Figure 10:
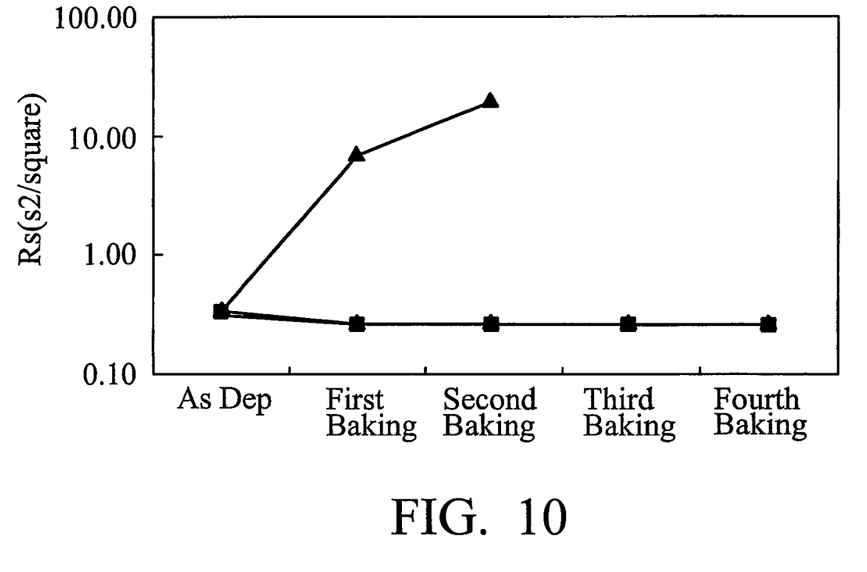
FIG. 10 illustrates sheet resistances of metal lines as a function of number of bakings.

FIG. 10 illustrates the integrity performance of metal lines, wherein sheet resistances of metal lines are illustrated as a function of number of bakings performed on samples. Diamonds represent the data obtained from a sample having a 70 Å dielectric barrier layer, which is formed using ATRP. Triangles represent the data obtained from a sample having no diffusion barrier layer. Squares represent the data obtained from a sample having a 70 Å tantalum diffusion barrier layer. It is noted that the sample having dielectric diffusion barrier layer exhibits integrity performance substantially comparable to the sample having a tantalum diffusion barrier layer, which is significantly improved over the sample having no barrier layer. The results show that after the first baking following the deposition of copper (As Dep), the sheet resistances of the preferred embodiments are substantially unchanged with the increase in the number of bakings, indicating a reliable adhesion between the dielectric barrier layer and copper.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an integrated circuit, the method comprising:
    forming a low-k dielectric layer over a semiconductor substrate;
    etching the low-k dielectric layer to form an opening;
    forming a dielectric barrier layer covering at least sidewalls of the opening, wherein the dielectric barrier layer comprises α-Terpinene (ATRP);
    performing a treatment to the dielectric barrier layer, the treatment forming a treated dielectric barrier layer consisting essentially of dielectric material, wherein process gases used in the step of performing the treatment comprise a nitrogen-containing gas and SiH$_4$, wherein after the treatment, a bottom portion of the treated dielectric barrier layer remains at a bottom of the opening;
    removing the bottom portion of the treated dielectric barrier layer, and wherein sidewall portions of the treated dielectric barrier layer are not removed; and
    after the step of removing the bottom portion of the treated dielectric barrier layer, filling the opening with a conductive material, wherein the conductive material contacts the dielectric material of the treated dielectric barrier layer along substantially the entire sidewall of the opening.

2. The method of claim 1, wherein the step of performing the treatment comprises:
   performing a first treatment step to treat the dielectric barrier layer using the nitrogen-containing gas; and
   performing a second treatment step to treat the dielectric barrier layer using process gases comprising $SiH_4$.

3. The method of claim 2, wherein during the second treatment step, the process gases further comprise $H_2$.

4. The method of claim 1, wherein the nitrogen-containing gas is selected from the group consisting essentially of $N_2$, $NH_3$, and combinations thereof.

5. The method of claim 4, wherein the process gases further comprise $H_2$.

6. The method of claim 1, wherein the step of performing the treatment comprises plasma-assisted treatment.

7. The method of claim 1, wherein the dielectric barrier layer has a thickness of between about 10 Å and about 100 Å.

8. The method of claim 1, wherein the step of performing the treatment is performed after the step of forming the dielectric barrier layer is finished.

9. The method of claim 1, wherein the conductive material has a top surface substantially coplanar with a top surface of the low-k dielectric layer.

10. A method of forming an integrated circuit, the method comprising:
    forming a low-k dielectric layer over a semiconductor substrate;
    etching the low-k dielectric layer to form an opening;
    forming a dielectric barrier layer comprising α-Terpinene (ATRP) on at least the sidewalls of the opening;
    performing a treatment to the dielectric barrier layer, the treatment forming a treated dielectric barrier layer, the treatment comprising process gases comprising $SiH_4$, the treated dielectric barrier layer comprising dielectric material throughout the treated dielectric barrier layer, wherein after the treatment, a bottom portion of the treated dielectric barrier layer remains at a bottom of the opening;
    removing the bottom portion of the treated dielectric barrier layer, and wherein sidewall portions of the treated dielectric barrier layer are not removed; and
    after the step of removing the bottom portion of the treated dielectric barrier layer, filling the opening with a conductive material, the conductive material being in contact with the dielectric material of the treated dielectric barrier layer along substantially the entire sidewall of the opening.

11. The method of claim 10, wherein the conductive material has a top surface substantially coplanar with a top surface of the low-k dielectric layer.

12. The method of claim 10, wherein the step of performing the treatment comprises:
    performing a first treatment step to treat the dielectric barrier layer using a nitrogen-containing gas; and
    performing a second treatment step to treat the dielectric barrier layer using process gases comprising $SiH_4$.

13. The method of claim 12, wherein during the second treatment step, the process gases further comprise $H_2$.

14. The method of claim 12, wherein the nitrogen-containing gas is selected from the group consisting essentially of $N_2$, $NH_3$, and combinations thereof.

15. The method of claim 14, wherein the process gases further comprise $H_2$.

* * * * *